Feb. 17, 1970 M. B. GOLDSTEIN 3,495,322

PROCESS FOR BONDING A SILICON WAFER TO A CERAMIC SUBSTRATE

Filed July 20, 1967

INVENTOR.
Marcy B. Goldstein
BY
Mueller, Aichele & Rauner
ATTY'S.

United States Patent Office 3,495,322
Patented Feb. 17, 1970

3,495,322
PROCESS FOR BONDING A SILICON WAFER TO A CERAMIC SUBSTRATE

Marcy B. Goldstein, Phoenix, Ariz., assignor to Motorola, Inc., Franklin Park, Ill., a corporation of Illinois
Filed July 20, 1967, Ser. No. 654,915
Int. Cl. B23k *31/02*
U.S. Cl. 29—473.1 9 Claims

ABSTRACT OF THE DISCLOSURE

An integrated circuit die is bonded to a ceramic substrate by a series of steps including the application of a molybdenum-manganese paint to the ceramic base by silk screening techniques. The paint is characterized by a ratio of manganese to molybdenum not greater than 1:4.5 and includes 1% to 10% by weight silica based on total solids. After drying and sintering the metallic powders in a wet hydrogen atmosphere, the metallized surface is cleaned with a 50% aqueous solution of hydrogen fluoride to remove any film of glass or ceramic formed on the metallized surface. A gold-germanium alloy preform is placed on the metallized surface and the parts are heated to at least 600° C. in a nonoxidizing atmosphere to provide intimate contact of the molten alloy with the metallized surface. Subsequently, at a temperature no greater than 450° C., the silicon die is placed in contact with the alloy phase whereby a metallurgical bond is formed.

This invention relates to the metallization of a ceramic substrate, and to the bonding of a semiconductor die to a metallized ceramic surface.

In the packaging of integrated microcircuits, the ceramic-glass flat package has proved to be both efficient and reliable. Typically, the flat package consists of a rectangular enclosure made of an alumina ceramic containing small amounts of one or more other oxides, such as magnesia, and/or calcia, and silica. The enclosure is fitted with peripheral leads made of a low-expansion metal, such as Kovar alloy, consisting primarily of iron, nickel and cobalt. Glass seals are formed surrounding leads, and final closure is completed after die bonding and wire bonding to incorporate the integrated circuit chip.

An expensive and time-consuming aspect of flat package assembly involves the bonding of the integrated circuit die to the ceramic base. The die bonding procedure generally begins with metallization of the central area of the ceramic base by applying a paint which consists primarily of molybdenum and manganese powders suspended in a suitable vehicle, followed by firing at 1400° to 1500° C. in a wet hydrogen atmosphere. The metallized ceramic surfaces are then gold plated by barrel techniques, while the silicon chip is vapor plated with a thin film of gold on the under surface.

The final bonding step of the procedure has involved a contact of the gold plated surfaces at about 450° C. in order to form a gold-silicon eutectic alloy phase for producing a metallurgical bond. This final step requires intimate contact between the gold plated metallized ceramic surface and the vapor plated base of the silicon chip. Since the metallized ceramic surface is rough and irregular, intimate contact is frequently difficult to achieve, producing an unreliable bond and a poor heat transfer interface in many instances. Moreover, the barrel plating techniques required for depositing gold on the metallized surface are inherently inefficient, and thus extremely expensive and time consuming. The resulting gold films frequently have an inconsistent thickness from one unit to the next, as well as uneven thickness on a given substrate. Consequently, an additional factor of reduced reliability is introduced.

In view of these difficulties there is an obvious need for improved die bonding techniques to increase the efficiency and reliabiliay of microelectronic packaging techniques.

The invention

It is an object of the invention to provide an improved method for bonding a semiconductor die to a ceramic substrate. More particularly, it is an object of the invention to increase the efficiency and reliability of the metallization and bonding aspects of microelectronic packaging techniques, and to produce silicon to ceramic bonds of greater uniformity and strength.

It is a further object of the invention to eliminate gold plating of the metallized ceramic surface, and to eliminate gold plating of the underside of a semiconductor die, in the formation of a semiconductor-ceramic bond.

A primary feature of the invention is the step of cleaning the metallized ceramic surface with a glass etchant such as aqueous hydrogen fluoride, for example, in order to promote adequate wetting of the metallized surface with the molten gold alloy used in forming the ultimate bond. Without the cleaning step a poor bond is obtained, presumably due to the presence of a thin film of glass inherently formed on the metallized surface, thereby reducing the ability of the molten alloy preform to intimately wet the metallized surface.

An additional feature of the invention involves the formation of a molten, gold-comprising alloy on the metallized ceramic substrate at a temperature of at least 600° C. in order to promote a more initmate contact of the alloy with the metallized surface. This temperature is far above the minimum required to liquefy the alloy preform, and is also far above the maximum temperature which can be tolerated by an integrated microcircuit. Therefore, it is not feasible to combine the ultimate bonding step with the step of wetting the preform to the metallized ceramic substrate.

Another feature of the invention involves the composition of the metallizing paint. The ratio of manganese to the other metal of the paint is no greater than 1:4.5. In addition to the metal powders the paint preferably includes 1 to 10% by weight silica or other fluxing agent as a sintering aid. A particularly suitable composition is 82% molybdenum, 11% manganese and 7% silca.

The invention is embodied in a method for bonding a semiconductor body to a ceramic substrate, including the step of applying to the substrate a mixture of powders comprising manganese and a metal selected from the group consisting of molybdenum, tungsten, and combinations thereof. The mixture may include up to 10% by weight of a fluxing agent or fusible binder, such as glass, pure silica or $TiO_2$, for example. The substrate and applied powders are then heated in a non-oxidizing atmosphere, containing water vapor, to sinter the powders and thereby form a tightly adherent metallic coating.

The metallized surface must then be chemically cleaned to expose a fresh metallic surface in order to promote wetting with the molten alloy preform in subsequent processing. Typically, the glass film removed during this step primarily results from the presence of silica or other fusible binder present in the metallizing paint. However, the paint need not contain such a binder, especially when the ceramic substrate includes a small proportion of silica or its eequivalent. When metallizing a silica-comprising ceramic, there is apparently a sufficient migration of the silica to the surface of the metallization layer with a consequent adverse effect upon the wettability of the metallic surface with respect to the molten alloy preform.

A molten alloy of gold and a metal selected from the group consisting of germanium, silicon, tin, and combinations thereof is then formed on the cleaned metallic surface of the ceramic substrate, at a temperature of at least 600° C. to promote a more intimate contact of the molten alloy with the metallized surface. The combination is then cooled to a temperature not greater than about 450° C., since this is generally the maximum temperature which can be tolerated by a completed silicon semiconductor device. The integrated circuit die or other semiconductor body is then placed in contact with the molten alloy thereby forming a completed metallurgical bond.

In a particular embodiment of the invention the mixture of powders applied to the ceramic base consists essentially of 75% to 90% by weight molybdenum, 5% to 18% by weight manganese, and 1% to 10% by weight silica, with the additional requirement that the ratio of manganese to molybdenum must be not greater than 1:4.5.

The invention is also embodied in a method for bonding a semiconductor body to a metallized ceramic substrate comprising the steps of chemically cleaning the metallized substrate surface with an etchant for glassy substances; forming on the cleaned metallic surface a molten alloy of gold and a metal selected from the group consisting of germanium, silicon, tin and combinations thereof; heating the alloy-bearing metallized substrate to at least 600° C. to promote more intimate wetting of the metallized surface with the alloy; cooling the assembly to a temperature not greater than about 450° C.; and placing the semiconductor body in contact with the molten alloy to form a metallurgical bond therewith.

Drawings

FIG. 2 is a separate view of a gold-germanium alloy preform used in the process of the invention; while

Figure 1:
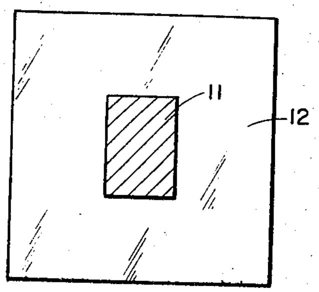
FIGS. 1 and 4 through 6 are plan views showing a metallized ceramic plate in the various processing stages of the invention.

In FIG. 1 metallized area 11 is located centrally with respect to ceramic plate 12. Techniques for the metallization of a ceramic substrate are well known. Usually such procedures include the application of a mixture of metal powders consisting of approximately 80% molybdenum and 20% manganese, suspended in a suitable vehicle and applied to the ceramic surface by silk screening. It is also known that the molybdenum can be partially or entirely replaced by tungsten, and that a small amount of powdered glass binder may be advantageously added. A suitable vehicle in which to disperse the metallic powders is selected from low-volatility solvents such as diethyleneglycol butylether, for example. The total solids content of the metallization paint should lie in the range 50% to 80% by weight.

Although it is within the broader scope of the invention to employ conventional metallization techniques in preparing a ceramic surface for the bonding thereto of a semiconductor body, best results are obtained by increasing the ratio of molybdenum or tungsten to manganese. A particularly suitable ratio of manganese to the other metal is about 1:7.5. The ratio should never exceed 1:4.5 and may be 1:10 or less. Silk screening is the preferred method of application, however, brushing, roller coating or spraying may be employed. The painted parts are then dried and fired at a temperature of 1,425° C. to 1,600° C. in a wet, non-oxidizing atmosphere.

Figure 2:

Preform 13 of FIG. 2 consists primarily of gold and silicon, germanium, or tin, the ratio of gold to the other metal being preferably just sufficient to constitute a eutectic alloy: multicomponent alloys such as gold containing germanium and silicon, germanium and tin or silicon and tin may be used, including a four-component alloy containing alloy containing gold, germanium, silicon and tin. Also, suitable bonding may be obtained by the use of an alloy preform containing a proportion of gold other than that required to form a eutectic mixture. However, such increased complexity is usually unnecessary and unwarranted.

The shape and dimensions of the alloy preform are not particularly critical. However, the preform should not be larger than the metallized area of the ceramic base, and the mass or weight of the alloy should be sufficient to provide a molten phase which substantially completely covers the metallized area. It is sufficient, however, to provide only that amount required to form a reliable bond.

Figure 3:
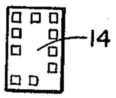
FIG. 3 is a separate view of the integrated circuit die to be bonded to the ceramic plate as shown in FIG. 6.

Semiconductor die 14 shown in FIG. 3 is an integrated circuit fabricated in monocrystalline silicon; however, other semiconductor materials may be bonded to a ceramic base in accordance with the method of the invention.

Figure 4:
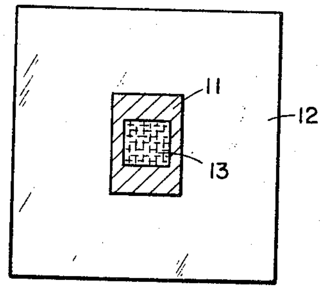
Figure 5:
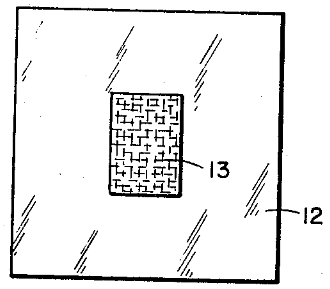

FIG. 4 illustrates the placement of alloy preform 13 upon metallized area 11 of ceramic plate 12. After firing to a temperature of at least 600° C., and preferably at least 700° C., the molten alloy preform spreads, intimately wetting substantially the entire metallized area, and upon cooling forms a reliable, strongly adherent bond, as illustrated in FIG. 5.

Figure 6:
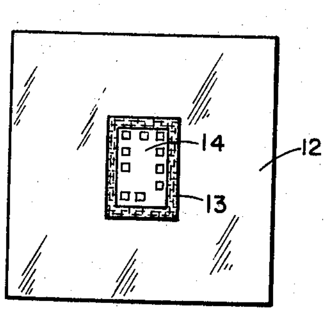

In the same, or in a subsequent heating cycle, the semiconductor die is placed in contact with molten alloy phase at a temperature not greater than 450° C., whereby an immediate metallurgical bond is formed as illustrated in FIG. 6.

It is to be particularly noted that the sequence of operations performed in accordance with the invention achieves a reliable, efficient bonding of the semiconductor die, without gold plating of the metallized ceramic surface, or gold plating of the underside of the semiconductor die. Moreover, because a molten alloy phase is present, no need arises to control the smoothness of the metallized surface. The bonds obtained are considerably stronger than was typical in the prior practice, because intimate contact across the entire interface of the bonded materials now becomes a certainty. Improved heat transfer is also obtained between the circuit die and the ceramic base.

A substantial savings in the cost of assembly results, since the cost of the gold-germanium preform, and the processing expense, are substantially less than with standard plating techniques. Moreover, the bonding operation is readily completed in a much shorter time than has heretofore been required.

Figure 7:
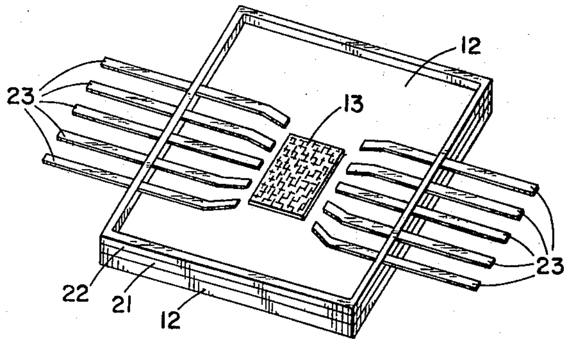
FIG. 7 is an isometric view of a ceramic-glass flat package prepared in accordance with one embodiment of the invention.

In accordance with a particularly advantageous embodiment of the invention, a ceramic-glass flat package preassembly is completed during the same heating cycle as described above for melting the gold-germanium alloy. Specifically, as shown in FIG. 7, a plurality of external leads 23 are sandwiched between glass preforms 21 and 22, and the assembly is held in place on the periphery of ceramic plate 12. Alloy preform 13 is also placed on metallized area 11 as shown in FIG. 4. The assembly is heated to a temperature in the range of 700° C. to 1100° C., whereupon glass preforms 21 and 22 are fused together, sealing leads 23 in place. Preform 21 also forms a seal with ceramic plate 12. Alloy preform 13 wets area 11 as previously illustrated in FIG. 5.

Upon cooling a preassembly is completed, which may be reheated to 400° C., for example, at a later time for the purpose of adding a semiconductor die to the molten alloy preform and thereby completing the die bonding sequence. On the other hand, if desired, the semiconductor die can be bonded during the same heating cycle by simply allowing the preassembly to cool to about 450° C. or below, and placing the die in contact with the molten alloy.

What is claimed is:

1. A method for bonding a semiconductor body to a ceramic substrate comprising the steps of:

(a) applying to said substrate a mixture of powders including manganese, a metal selected from the group consisting of molybdenum, tungsten, and combinations thereof, and 0–10% by weight of a sintering aid;

(b) heating the substrate and applied powders in a non-oxidizing atmosphere containing water vapor, to sinter said powders and thereby form a tightly adherent metallic coating;

(c) chemically cleaning the metallized substrate surface;

(d) forming on the cleaned metallic surface a molten alloy of gold and a metal selected from a group consisting of germanium, silicon, tin, and combinations thereof;

(e) heating the alloy-bearing metallized substrate to at least 600° C. to promote flow and wetting of the metallized surface with the molten alloy;

(f) cooling the combination to a temperature not greater than about 450° C. and placing the semiconductor body in contact with the molten alloy, thereby forming a metallurgical bond.

2. A method as defined by claim 1 wherein said semiconductor is silicon, and wherein said mixture of powders consists essentially of 75% to 90% by weight molybdenum, 5% to 18% by weight manganese, and 1% to 10% by weight silica as said sintering aid.

3. A method as defined by claim 1 wherein the ratio of manganese to the other metal in said mixture of powders is no greater than 1:4.5.

4. A method as defined in claim 1 wherein step (b) includes a temperature of at least 1425° C.

5. A method as defined by claim 1 wherein step (c)

includes contacting said metallized substrate with aqueous HF.

6. A method as defined by claim 1 wherein said molten alloy is gold-germanium, and step (e) includes a temperature of at least 700° C.

7. A method for bonding a semiconductor body to a metallized ceramic substrate comprising the steps of:

(a) chemically cleaning the metallized substrate surface;

(b) forming on the cleaned metallic surface a molten alloy of gold and a metal selected from the group consisting of germanium, silicon, tin, and combinations thereof;

(c) heating the alloy bearing metallized substrate to at least 600° C. to promote wetting and achieve a more intimate contact of alloy with the metallized surface;

(d) cooling the assembly to a temperature not greater than about 450° C., and placing a semiconductor body in contact with the molten alloy to form a metallurgical bond therewith.

8. A method as defined by claim 7 wherein step (a) includes contacting said metallized substrate with aqueous HF.

9. A method as defined by claim 7 wherein said semiconductor is silicon, said molten alloy is gold-germanium and step (c) includes a temperature of at least 700° C.

References Cited

UNITED STATES PATENTS 2,902,756 9/1959 Cavanaugh ---------- 29—473.1

FOREIGN PATENTS 540,991 11/1941 Great Britain.

JOHN F. CAMPBELL, Primary Examiner

RONALD SHORE, Assistant Examiner